(12) United States Patent
He et al.

(10) Patent No.: US 11,309,406 B2
(45) Date of Patent: Apr. 19, 2022

(54) METHOD OF MANUFACTURING AN LDMOS DEVICE HAVING A WELL REGION BELOW A GROOVE

(71) Applicant: CSMC TECHNOLOGIES FAB2 CO., LTD., Jiangsu (CN)

(72) Inventors: Nailong He, Wuxi New District (CN); Sen Zhang, Wuxi New District (CN); Guangsheng Zhang, Wuxi New District (CN); Yun Lan, Wuxi New District (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/770,362

(22) PCT Filed: Dec. 5, 2018

(86) PCT No.: PCT/CN2018/119252
§ 371 (c)(1),
(2) Date: Jun. 5, 2020

(87) PCT Pub. No.: WO2019/109924
PCT Pub. Date: Jun. 13, 2019

(65) Prior Publication Data
US 2021/0175347 A1 Jun. 10, 2021

(30) Foreign Application Priority Data
Dec. 6, 2017 (CN) .......................... 201711278066.7

(51) Int. Cl.
*H01L 29/66* (2006.01)
*H01L 21/762* (2006.01)
(Continued)

(52) U.S. Cl.
CPC .... *H01L 29/66696* (2013.01); *H01L 21/0334* (2013.01); *H01L 21/76224* (2013.01);
(Continued)

(58) Field of Classification Search
CPC .......................... H01L 29/66681–66704; H01L 29/7816–7826; H01L 29/7835;
(Continued)

(56) References Cited

U.S. PATENT DOCUMENTS

| 5,378,912 A | 1/1995 | Pein |
| 5,777,365 A | 7/1998 | Yamaguchi et al. |

(Continued)

FOREIGN PATENT DOCUMENTS

| CN | 101207125 A | 6/2008 |
| CN | 102468335 A | 5/2012 |

(Continued)

OTHER PUBLICATIONS

Chinese Office Action dated Apr. 29, 2020 in counterpart Patent Application No. 201711278066.7 (8 pages).
(Continued)

*Primary Examiner* — Younes Boulghassoul
(74) *Attorney, Agent, or Firm* — Polsinelli PC

(57) ABSTRACT

A manufacturing method of an LDMOS device comprises: obtaining a wafer formed with a doped region having a first conductivity type, wherein a top buried layer is formed inside the doped region having the first conductivity type, and a field oxide insulation layer structure is formed on the top buried layer; disposing a trench on the doped region having the first conductivity type, wherein the trench extends to the top buried layer and the field oxide insulation layer structure such that a portion of the top buried layer is removed; injecting an ion of a second conductivity type to form a well region below the trench; and forming a doped
(Continued)

source region in the well region. The first conductivity type and the second conductivity type are opposite conductivity types.

9 Claims, 4 Drawing Sheets

(51) Int. Cl.
*H01L 29/417* (2006.01)
*H01L 21/033* (2006.01)
*H01L 29/06* (2006.01)
*H01L 29/78* (2006.01)
*H01L 29/423* (2006.01)

(52) U.S. Cl.
CPC .... *H01L 29/0653* (2013.01); *H01L 29/41766* (2013.01); *H01L 29/42368* (2013.01); *H01L 29/66704* (2013.01); *H01L 29/7816* (2013.01); *H01L 29/7825* (2013.01)

(58) Field of Classification Search
CPC ........... H01L 29/66659; H01L 29/1095; H01L 29/7825; H01L 29/66621; H01L 29/4236; H01L 29/0607–0638; H01L 29/402–407; H01L 29/66696; H01L 29/42368; H01L 29/41766

See application file for complete search history.

(56) References Cited

U.S. PATENT DOCUMENTS

| | | | | |
|---|---|---|---|---|
| 9,171,916 | B1* | 10/2015 | Snyder | H01L 29/66659 |
| 2009/0039424 | A1* | 2/2009 | Su | H01L 29/404 |
| | | | | 257/339 |
| 2009/0140343 | A1* | 6/2009 | Feilchenfeld | H01L 29/66704 |
| | | | | 257/367 |
| 2011/0241114 | A1* | 10/2011 | Su | H01L 29/0634 |
| | | | | 257/343 |
| 2013/0049114 | A1* | 2/2013 | Wang | H01L 29/0619 |
| | | | | 257/339 |
| 2013/0126969 | A1* | 5/2013 | Lee | H01L 29/66068 |
| | | | | 257/335 |
| 2013/0140632 | A1* | 6/2013 | Landgraf | H01L 29/401 |
| | | | | 257/335 |
| 2014/0042499 | A1* | 2/2014 | Zhang | H01L 29/7816 |
| | | | | 257/288 |
| 2014/0264584 | A1* | 9/2014 | Zhang | H01L 29/4236 |
| | | | | 257/343 |
| 2015/0155379 | A1* | 6/2015 | Kumar | H01L 29/66659 |
| | | | | 257/330 |
| 2015/0325651 | A1* | 11/2015 | Yao | H01L 29/7816 |
| | | | | 257/339 |
| 2016/0211329 | A1* | 7/2016 | Chou | H01L 21/76205 |
| 2017/0194491 | A1* | 7/2017 | Zhang | H01L 29/0657 |
| 2018/0350799 | A1* | 12/2018 | Ho | H01L 28/20 |

FOREIGN PATENT DOCUMENTS

| | | |
|---|---|---|
| CN | 105428415 A | 3/2016 |
| JP | 2000-164860 A | 6/2000 |
| KR | 10-2009-0070513 A | 7/2009 |

OTHER PUBLICATIONS

International Search Report dated Mar. 11, 2019 in the parent application PCT/CN2018/119252 (2 pages).
Korean Office Action dated Apr. 2, 2021 issued in corresponding Patent Application No. 10-2020-7016356 (6 pages).

* cited by examiner

METHOD OF MANUFACTURING AN LDMOS DEVICE HAVING A WELL REGION BELOW A GROOVE

CROSS-REFERENCE TO RELATED APPLICATIONS

This application is a National Phase of International Application No. PCT/CN2018/119252, filed on Dec. 5, 2018, which claims priority to Chinese Patent Application No. 201711278066.7, entitled "LDMOS DEVICE AND MANUFACTURING METHOD THEREOF" filed on Dec. 6, 2017, the contents of which are expressly incorporated by reference herein in their entireties.

TECHNICAL FIELD

The present disclosure relates to LDMOS (Laterally Diffused Metal Oxide Semiconductor), and more particularly relates to a LDMOS device and a method of making thereof.

BACKGROUND

Among current LDMOS devices, a typical one is a double resurf (double reduced surface electric field) LDMOS device. In the double resurf LDMOS device, the surface electric field of the double resurf LDMOS device is reduced by a polysilicon gate field plate/metal field plate being combined with a P-type doped region of a drift region surface, thereby obtaining a high source-drain breakdown voltage (for short BV) and a low on-resistance. But a current path passes through a JFET region (PN Junction Field-Effect Transistor region). A size and a doping concentration of the JFET region may limit the on-resistance of the LDMOS device. The larger the size and the doping concentration of the JFET region are, the larger the on-resistance of the LDMOS device is. However, to ensure a higher source-drain breakdown voltage, it has to sacrifice a certain on-resistance.

SUMMARY

In view of this, a LDMOS device and a method of making a LDMOS device are provided.

A method of making a LDMOS device includes:

obtaining a wafer in which a first conductive type doped region is formed, a top buried layer is formed in the first conductive type doped region, and a field oxidation insulating layer structure is formed on the top buried layer;

opening a groove on the first conductive type doped region, the groove extending to the top buried layer and the field oxidation insulating layer structure to remove a part of the top buried layer;

injecting ions of a second conductive type to form a well region below the groove;

forming a source doped region in the well region; the first conductive type and the second conductive type being opposite conductive types.

A LDMOS device includes: a substrate;

a first conductive type doped region, disposed on the substrate for functioning as a drift region;

a groove, opened on the first conductive type doped region;

a well region, having a second conductive type, disposed below the groove;

a source doped region, disposed in the well region;

a top buried layer, having the second conductive type, disposed in the first conductive type doped region, one end extending to the groove; and a field oxidation insulating layer structure, disposed above the top buried layer, one end extending to the groove; the first conductive type and the second conductive type being opposite conductive types.

A bottom of the groove is lower than a bottom of the top buried layer.

Details of one or more embodiments of the present disclosure are set forth in the following drawings and description. Other features, objects and advantages of the present disclosure will become apparent from the specification, drawings and claims.

BRIEF DESCRIPTION OF THE DRAWINGS

The above and other objects, features and advantages of the present disclosure will become more apparent from the more detailed description of the preferred embodiments of the present disclosure shown in the drawings. The same reference numerals in all drawings indicate the same parts, and the drawings are not intentionally drawn to scale with actual dimensions. The focus is on illustrating the spirit of the present disclosure.

DETAILED DESCRIPTION OF THE EMBODIMENTS

Figure 1:
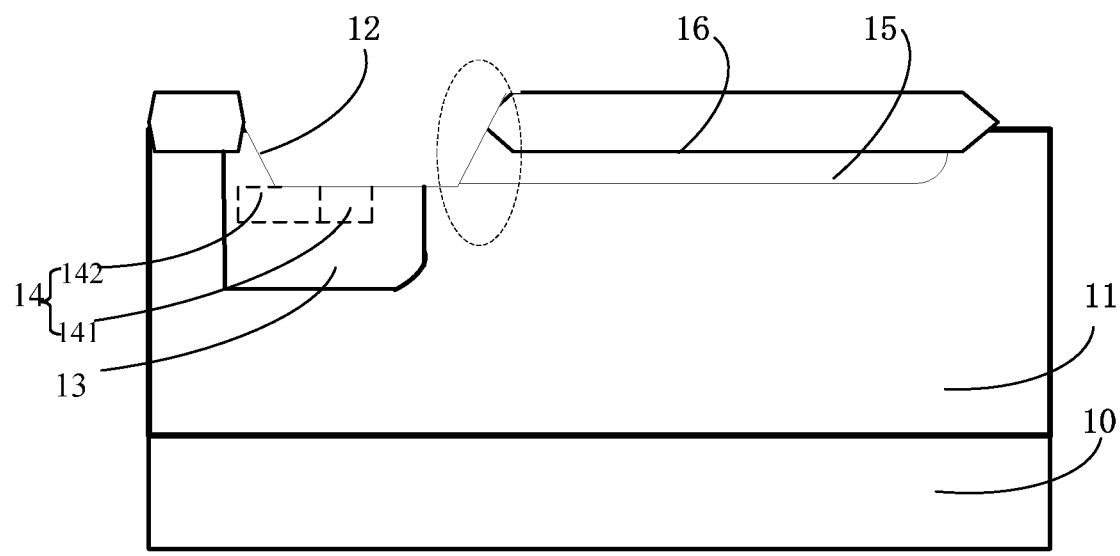
FIG. 1 is a structural schematic diagram of a LDMOS device in one embodiment.

In order to facilitate understanding the present disclosure, the present disclosure will be more fully described with reference to the relate drawings below. Preferred embodiments of the present disclosure are shown in the drawings. However, the present disclosure may be implemented in many different forms and is not limited to the embodiments described herein. Conversely, the purpose of providing these embodiments is to make the content of the present disclosure more thorough and comprehensive.

Unless otherwise defined, all technical and scientific terms used herein have the same meaning as generally understood by those skilled in the art belonging to the present disclosure. The terms used herein in the specification of the present disclosure are only for the purpose of describing specific embodiments, and not intended to limit the present disclosure. The terms "and/or" used herein include any and all combinations of one or more related listed items.

It should be noted that when an element is referred to as being "fixed" to another element, it may be directly on the other element or there may also be an intervening element. When one element is considered to "connect" another element, it may be directly connected to the other element or there may be an intervening element at the same time. The terms "vertical", "horizontal", "up", "down", "left", "right" and the like expression used herein are only for illustrative purposes.

In an embodiment, please referring to FIG. 1, a LDMOS device includes a substrate 10, a first conductive type doped region 11, a groove 12, a well region 13, a source doped region 14, a top buried layer 15 and a field oxidation insulating layer structure 16. The first conductive type doped region 11 is disposed on the substrate 10 for functioning as a drift region. The groove 12 is opened on the first conductive type doped region 11. The well region 13 is disposed below the groove 12, wherein the well region 13 has a second conductive type. The source doped region 14 is disposed in the well region 13. The top buried layer 15 is disposed in the first conductive type doped region 11 (i.e. in the drift region), and one end of the top buried layer 15 extends to the groove 12. The top buried layer 15 has the second conductive type. The field oxidation insulating layer structure 16 is disposed above the top buried layer 15, and one end extends to the groove. The first conductive type and the second conductive type are opposite conductive types.

In one of the embodiments, please referring to FIG. 1, the source doped region 14 may include a first conductive type source doped region 141 and a second conductive type source doped region 142, where one of the first conductive type and the second conductive type is P-type and the other is N-type. The source doped region 14 then includes a P-type source doped region and an N-type source doped region.

For example, the first conductive type is N-type, and the second conductive type is P-type correspondingly. Accordingly, the substrate 10 is a P-type substrate, and the drift region is an N-type drift region which may specifically be an N-type drift region (N-type representing of N-type with lightly doping concentration). The well region 13 is a P well. The top buried layer 15 is a P-type top buried layer. The first conductive type may also be P-type, and the second conductive type is N-type correspondingly. Accordingly, the substrate 10 is an N-type substrate, the drift region is a P-type drift region, the well region 13 is an N well, and the top buried layer 15 is an N-type top buried layer.

In one of the embodiments, a bottom of the groove 12 is lower than a bottom of the top buried layer 15, so that the groove 12 is deeper than the top buried layer 15. The groove 12 may further be deeper than a PN junction formed by the top buried layer 15 and the drift region.

In one of the embodiments, please referring to FIG. 1, a part of the field oxidation insulating layer structure 16 is disposed above the first conductive type doped region 11, and the rest of the field oxidation insulating layer structure 16 is disposed above the top buried layer 15.

Figure 2:
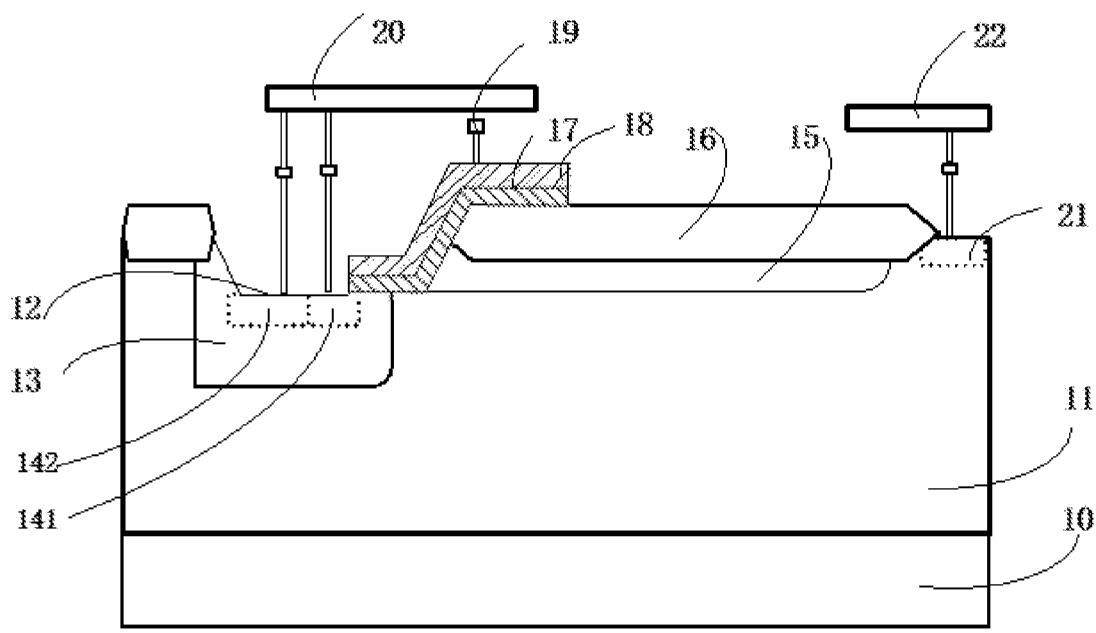
FIG. 2 is a structural schematic diagram of a LDMOS device in another embodiment.

In one of the embodiments, please referring to FIG. 2, the LDMOS device further includes a gate oxide structure 17, gate polycrystalline silicon 18 (a streak structure in FIG. 2), and a gate leading-out terminal 19. In the embodiment shown in FIG. 2, the gate oxide structure 17 is disposed at the bottom of the groove 12 and at a side wall of the groove 12 near the top buried layer 15. The gate oxide structure 17 further extends over a part of a surface of the field oxidation insulating layer structure 16. Specifically, as shown in FIG. 2, the gate oxide structure 17 covers a part of the bottom of the groove 12, a side of the groove 12 near the top buried layer 15, and a part of the surface of the field oxidation insulating layer structure 16. The gate polycrystalline silicon 18 is disposed on the gate oxide structure 17. The gate leading-out terminal 19 is electrically connected to the gate polycrystalline silicon 18. In other embodiments, the gate oxide structure 17 may also be disposed at the bottom of the groove 12 and at the side wall of the groove 12 near the top buried layer 15, and the gate oxide structure 17 may not extend to the surface of the field oxidation insulating layer structure, and the gate oxide structure 17 covers a part of the bottom of the groove 12 and a part of a surface of the top buried layer 15.

In an embodiment, please referring to FIG. 2, the LDMOS device further includes a source leading-out terminal 20. The source leading-out terminal 20 is electrically connected to the first conductive type source doped region 141 and the second conductive type source doped region 142, respectively.

In an embodiment, please referring to FIG. 2, the LDMOS device further includes a drain doped region 21 and a drain leading-out terminal 22. The drain doped region 21 is disposed on the first conductive type doped region 11. The drain doped region 21 and the source doped region 14 are separated by the field oxidation insulating layer structure. The drain doped region 21 has the first conductive type. The drain leading-out terminal 22 is electrically connected to the drain doped region 21.

In the LDMOS devices as described above, the groove 12 is opened and the well region 13 is disposed below the groove 12, so that the position of the well region 13 is adjusted downward, and the top buried layer 15 and the field oxidation insulating layer structure 16 extend to the groove 12. Therefore no first conductive type doped region exist between the top buried layer 15 and the field oxidation insulating layer structure 16, or among the top buried layer 15, the field oxidation insulating layer structure 16 and the groove 12. In this way, the conductive channel does not pass through the JFET region. The size of the on-resistance of the LDMOS can be released from the limitation of the JFET region. A lower on-resistance can be obtained while a high source-drain breakdown voltage is obtained.

Methods of making the LDMOS devices are also set forth.

Figure 3:
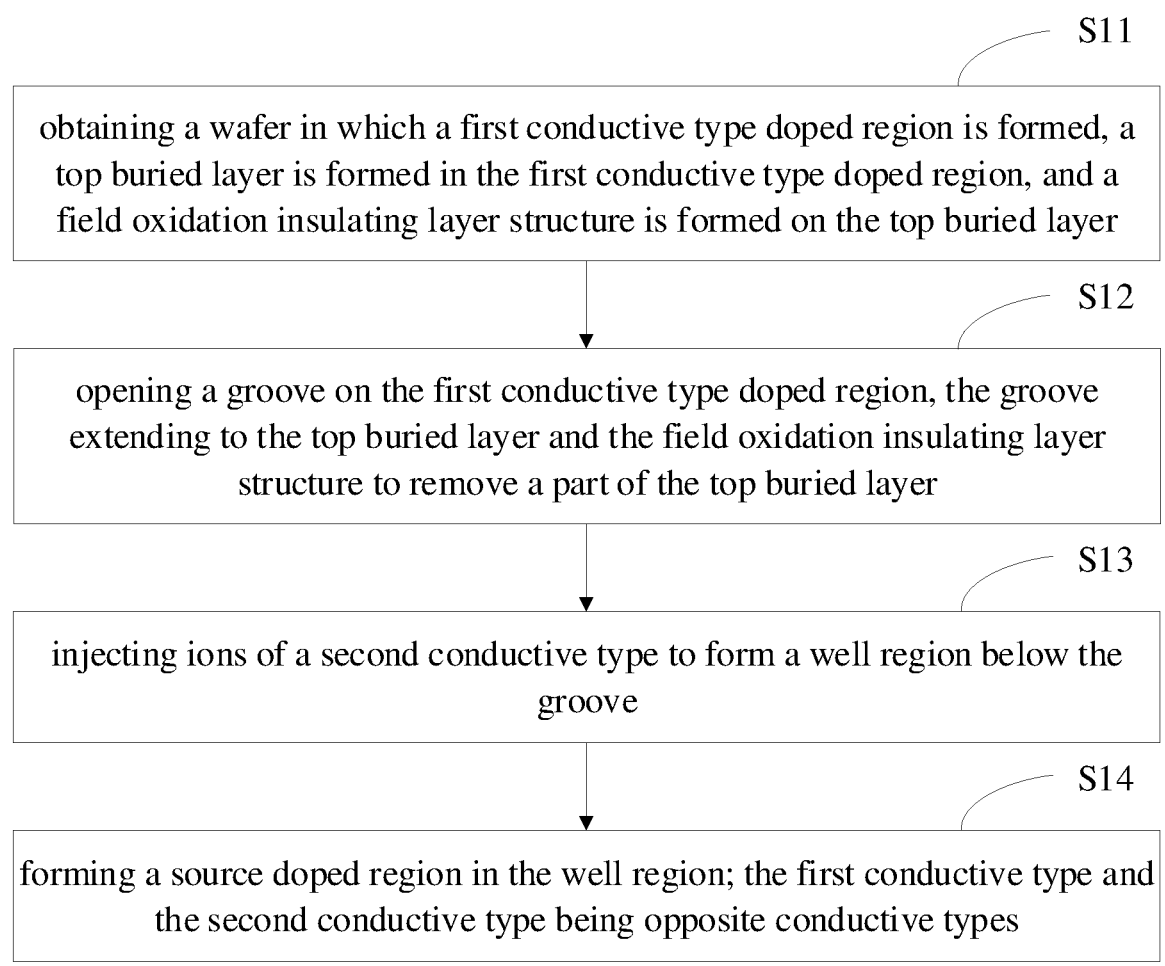
FIG. 3 is a flow chart of a method of making a LDMOS device in an embodiment.

In an embodiment, the method of making the LDMOS device can manufacture the LDMOS device as shown in FIG. 1. Please referring to FIG. 3, the method of making the LDMOS device may include the following steps:

Step S11: a wafer is obtained in which the first conductive type doped region 11 is formed, the top buried layer 15 is formed in the first conductive type doped region 11, and the field oxidation insulating layer structure 16 is formed on the top buried layer 15.

Figure 4:
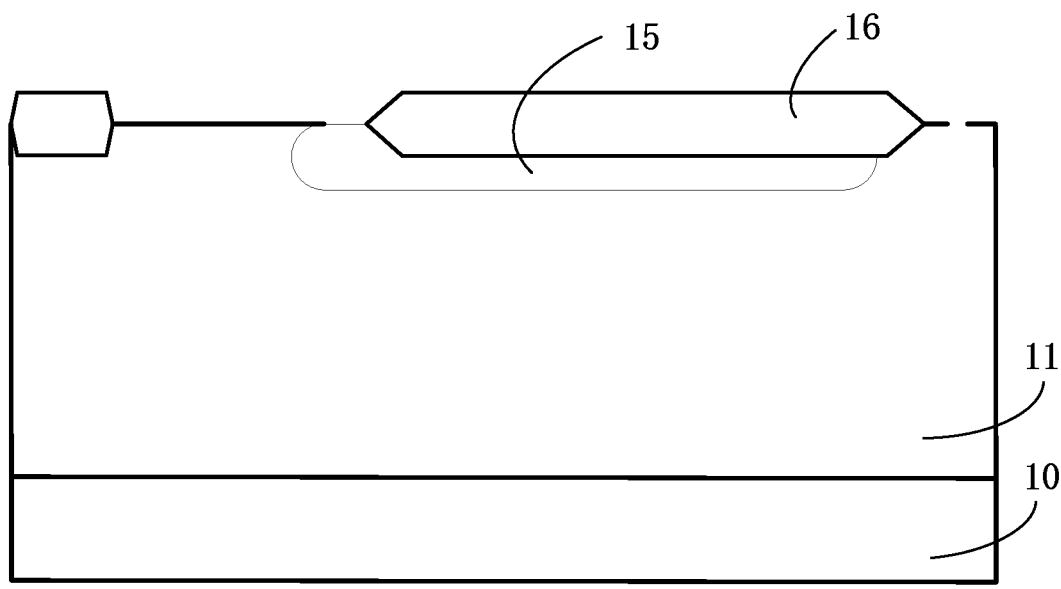
FIG. 4 is a structural schematic diagram of a LDMOS device in a process of making the LDMOS device in one embodiment.

As shown in FIG. 4, the first conductive type doped region is formed on a substrate 10. The substrate 10 has a second conductive type. Then the first conductive type doped region 11 is formed on the substrate 10 as a drift region. Then the top buried layer 15 is formed in the drift region. Then the field oxidation insulating layer structure 16 is formed on the top buried layer 15. The substrate has the second conductive type. The wafer may have a structure as shown in FIG. 4.

In an embodiment, as shown in FIG. 4, the implementation steps of the step S11 include the following steps: First, the top buried layer 15 is formed in the first conductive type doped region 11. Then the field oxidation insulating layer structure 16 is formed on the top buried layer 15, and partially covers the top buried layer 15. A section of the top buried layer 15 at a position near the groove opened later is exposed from under the field oxidation insulating layer structure 16. As shown in FIG. 4, in the embodiment the field oxidation insulating layer structure 16 is formed on the top buried layer 15 and the drift region. The top buried layer 15 encases a bottom region of the field oxidation insulating layer structure near the source doped region (the bottom region of the field oxidation insulating layer structure on the left as shown in FIG. 4).

Step S12: the groove is opened on the first conductive type doped region and the groove extends to the top buried layer and the field oxidation insulating layer structure to remove a part of the top buried layer.

Figure 5:
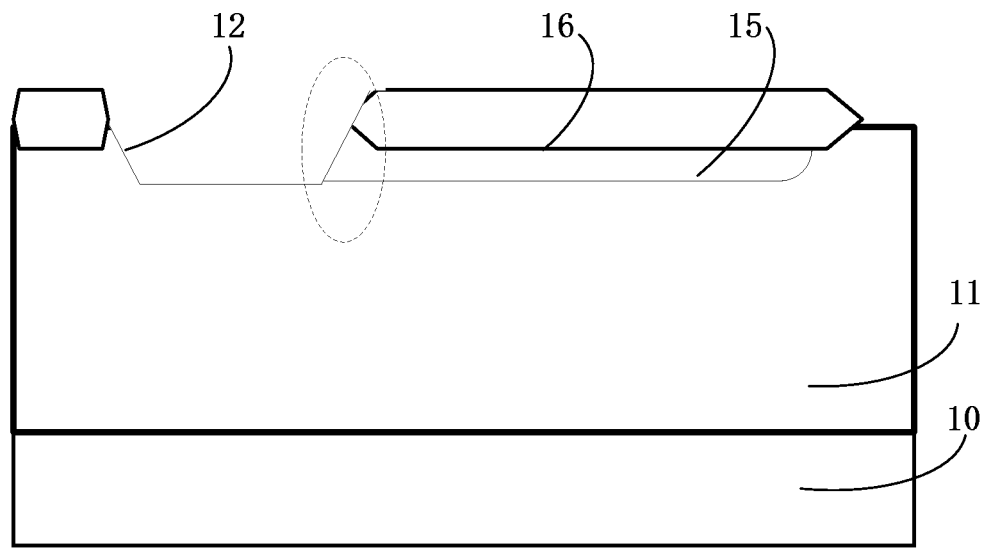
FIG. 5 is a structural schematic diagram of a LDMOS device in a process of making the LDMOS device in another embodiment.

As shown in the oval circle of FIG. 5, no first conductive type doped region exist between the top buried layer and the field oxidation insulating layer structure, or among the top buried layer, the field oxidation insulating layer structure and the groove, and therefore the conductive channel does not pass through the JFET region.

In one of the embodiments, as shown in FIG. 5, the step of opening the groove 12 on the first conductive type doped region 11 is to open the groove 12 at a position lower than the bottom of the top buried layer, such that the bottom of the groove 12 formed on the first conductive type doped region 11 is lower than the bottom of the top buried layer 15. In other embodiments, the formed bottom of the groove 12 may further be lower than the PN junction formed by the top buried layer 15 and the drift region.

In one of the embodiments, the step of opening the groove on the first conductive type doped region is to etch using the field oxidation insulating layer structure as a hard mask. For example, as shown in FIG. 5, there are a field oxidation insulating layer structure A and a field oxidation insulating layer structure B on the drift region. The field oxidation insulating layer structure A and the field oxidation insulating layer structure B are arranged in a left-to-right direction (a current direction). The groove is formed on the drift region in the middle of the field oxidation insulating layer structure. The field oxidation insulating layer structure is used to separate the source doped region and the drain doped region. Therefore the drift region on the left side of the field oxidation insulating layer structure A and the drift region on the right side of the field oxidation insulating layer structure B are used to form the drain doped region without opening the groove.

Step S13: ions of a second conductive type are injected to form the well region below the groove 12.

According to this step, on the groove 12 in the structure of FIG. 5, the well region is formed by ion injection. The structure after the formation of the well region is shown in FIG. 1.

Step S14: the source doped region is formed in the well region. The structure after the formation of the source doped region is shown in FIG. 1. The first conductive type and the second conductive type are opposite conductive types, where the first conductive type may be N-type and the second conductive type corresponds to be P-type.

In one of the embodiments, please referring to FIG. 1, the step of forming the source doped region in the well region is to form the first conductive type source doped region and the second conductive type source doped region in the well region. The first conductive type source doped region is located closer to the top buried layer. After the step of forming the source doped region in the well region, the source leading-out terminal is led out on the first conductive type source doped region and the second conductive type source doped region. The first conductive type source doped region may be the N-type source doped region, and correspondingly, the second conductive type source doped region is a P-type doped region.

Figure 6:
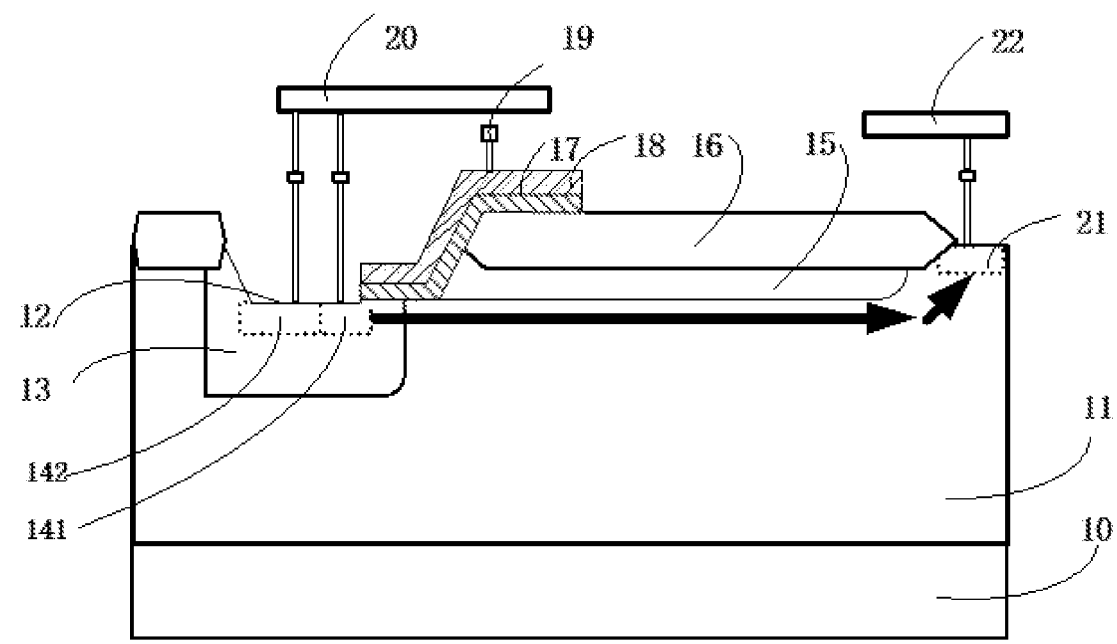
FIG. 6 is a structural schematic diagram of a LDMOS device in a process of making the LDMOS device in still another embodiment.

In one of the embodiments, please referring to FIG. 6, after the step of opening the groove on the first conductive type doped region, the step of forming the gate oxide structure 17 is included. Specifically, a continuous gate oxide structure is formed at the bottom of the groove 12 and at the side wall of the groove 12 near the top buried layer 15. The formed gate oxide structure 17 covers a part of the bottom of the groove 12 and a part of the surface of the top buried layer 15. In other embodiments, please referring to FIG. 6, the gate oxide structure 17 may further extend over a part of the surface of the field oxidation insulating layer structure 16. The formed gate oxide structure 17 covers a part of the bottom of the groove 12, a side wall of the groove 12 near the top buried layer 15, and a part of the surface of the field oxidation insulating layer structure 16. For example, as shown in FIG. 6, this side wall of the groove 12 near the top buried layer 15 is the right side wall of the groove extending to the top buried layer 15 and the field oxidation insulating layer structure 16. The current direction in FIG. 6 is from left to right.

After the gate oxide structure 17 is formed, the gate polycrystalline silicon 18 is deposited and formed on the gate oxide structure 17. The gate leading-out terminal 19 is led out at the gate polycrystalline silicon 18.

In the embodiment, the step of forming the gate oxide structure 17 and the gate polycrystalline silicon 18 may be executed after the groove 12 is opened. Specifically, it may be executed after the well region and the source doped region are formed.

In an embodiment, please preferring to FIG. 6, the method of making the LDMOS device further includes the following steps: the drain doped region 21 is formed in the first conductive type doped region 11, then the drain leading-out terminal is led out from the drain doped region 21. The drain doped region 21 and the source doped region 14 are separated by the field oxidation insulating layer structure 16. The drain doped region 21 has the first conductive type. The current flows form the first conductive type source doped region into the drain doped region.

According to the methods of making the LDMOS devices as discussed above, the position of the well region is adjusted downward (formed below the groove), and the top buried layer and the field oxidation insulating layer structure extend to the groove, such that no first conductive type doped region exist between the top buried layer and the field oxidation insulating layer structure, or among the top buried layer, the field oxidation insulating layer structure and the groove. In this way, the conductive channel does not pass through the JFET region. The size of the on-resistance of the LDMOS can be released from the limitation of the JFET region. A lower on-resistance can be obtained while a high source-drain breakdown voltage is obtained.

The technical features of the above-described embodiments may be arbitrarily combined, and all possible combinations of the respective technical features in the above embodiments are not described for the sake of brevity of the description. However, as long as the combinations of these technical features are not contradictory, they should be considered to be within the scope of this specification.

The above-described embodiments represent only a few implementations of the present disclosure, the description of which is more specific and detailed, but is not therefore to be understood as limiting the scope of the present disclosure patent. It should be noted that several modifications and improvements may be made to those ordinary skilled in the art without departing from the present disclosure concept, all of which fall within the scope of the present disclosure. Therefore, the protection scope of the present disclosure patent shall be subject to the appended claims.

What is claimed is:

1. A method of making a LDMOS device, comprising:
obtaining a wafer in which a first conductive type doped region is formed, a top buried layer is formed in the first conductive type doped region, and a field oxidation insulating layer structure is formed on the top buried layer;
opening a groove on the first conductive type doped region, the groove extending to the top buried layer and the field oxidation insulating layer structure to remove a part of the top buried layer;
injecting ions of a second conductive type to form a well region below the groove; and
forming a source doped region in the well region; the first conductive type and the second conductive type being opposite conductive types,
wherein the step of opening the groove on the first conductive type doped region is to etch using the field oxidation insulating layer structure as a hard mask.

2. The method according to claim 1, wherein in the step of opening the groove on the first conductive type doped region, a formed bottom of the groove is lower than a bottom of the top buried layer.

3. The method according to claim 2, wherein in the step of opening the groove on the first conductive type doped region, the formed bottom of the groove is lower than a PN junction formed by the top buried layer and the first conductive type doped region.

4. The method according to claim 1, wherein the step of obtaining a wafer in which a first conductive type doped region is formed, a top buried layer is formed in the first conductive type doped region, and a field oxidation insulating layer structure is formed on the top buried layer comprises:
forming the top buried layer in the first conductive type doped region;
forming the field oxidation insulating layer structure on the top buried layer, the field oxidation insulating layer structure partially covering the top buried layer, a section of the top buried layer at a position near the groove being exposed from under the field oxidation insulating layer structure.

5. The method according to claim 1, wherein the first conductive type is N-type, and the second conductive type is P-type.

6. The method according to claim 1, wherein after the step of opening the groove on the first conductive type doped region, the method further comprises: forming a continuous gate oxide structure at the bottom of the groove and at a side wall of the groove near the top buried layer.

7. The method according to claim 6, wherein the gate oxide structure further extends to a part of a surface of the field oxidation insulating layer structure.

8. The method according to claim 1, wherein the step of forming the source doped region in the well region is to form a first conductive type source doped region and a second conductive type source doped region in the well region, the first conductive type source doped region being located closer to the top buried layer.

9. The method according to claim 8, wherein the method further comprises:
forming a drain doped region in the first conductive type doped region, the drain doped region and the source doped region being separated by the field oxidation insulating layer structure, the drain doped region having the first conductive type.

* * * * *